United States Patent
Ohsumi et al.

(10) Patent No.: US 6,590,274 B2
(45) Date of Patent: Jul. 8, 2003

(54) SEMICONDUCTOR WAFER AND METHOD FOR MANUFACTURING SEMICONDUCTOR DEVICES

(75) Inventors: Takashi Ohsumi, Tokyo (JP); Yuzo Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/916,320

(22) Filed: Jul. 30, 2001

(65) Prior Publication Data

US 2001/0041425 A1 Nov. 15, 2001

Related U.S. Application Data

(62) Division of application No. 09/521,888, filed on Mar. 9, 2000, now Pat. No. 6,303,470.

(30) Foreign Application Priority Data

Mar. 11, 1999 (JP) ............................................. 11-065160

(51) Int. Cl.[7] ............................................. H01L 23/544
(52) U.S. Cl. ..................... 257/620; 257/797; 438/462
(58) Field of Search ................................ 257/620, 797; 438/462

(56) References Cited

U.S. PATENT DOCUMENTS

| | | | | |
|---|---|---|---|---|
| 5,777,392 A | * | 7/1998 | Fujii | ......................... 257/620 |
| 6,207,473 B1 | * | 3/2001 | Hirai et al. | ................... 257/620 |
| 6,228,743 B1 | * | 5/2001 | Chen et al. | ................... 257/797 |
| 6,303,470 B1 | * | 10/2001 | Ohsumi et al. | ............. 438/113 |
| 6,329,700 B1 | * | 12/2001 | Ishimura et al. | ............ 257/620 |
| 6,335,560 B1 | * | 1/2002 | Takeuchi | ..................... 257/618 |

FOREIGN PATENT DOCUMENTS

| | | |
|---|---|---|
| JP | 2-65153 | 3/1990 |
| JP | 7-6982 | 1/1995 |
| JP | 7-106638 | 4/1995 |
| JP | 7-509104 | 10/1995 |
| JP | 9-199588 | 7/1997 |
| JP | 10-275919 | 10/1998 |

OTHER PUBLICATIONS

Nikkei Microdevices, pp. 164–167, Apr. 1998.

* cited by examiner

Primary Examiner—Richard Elms
Assistant Examiner—Christian D. Wilson
(74) Attorney, Agent, or Firm—Volentine Francos, PLLC (57) ABSTRACT

A semiconductor wafer which is covered by an opaque resin in a dicing process includes marks formed on the semiconductor wafer, where the marks are distinguished from electrodes formed on the semiconductor wafer. In a dicing process, separating semiconductor chips from the semiconductor wafer can be precisely achieved.

4 Claims, 11 Drawing Sheets

SEMICONDUCTOR WAFER AND METHOD FOR MANUFACTURING SEMICONDUCTOR DEVICES

CROSS REFERENCE TO RELATED APPLICATIONS

This is a divisional application of application Ser. No. 09/521)888, filed Mar. 9, 2000, now U.S. Pat. No. 6,303,470, which is hereby incorporated by reference in its entirety for all purposes.

FIELD OF THE INVENTION

The present invention relates to a method for manufacturing semiconductor devices, and particularly, the present invention relates to a semiconductor wafer and to method for dividing a semiconductor wafer which is covered by an opaque resin in a dicing process.

BACKGROUND OF THE INVENTION

A method has been proposed for the manufacture semiconductor devices which includes a step of covering a semiconductor wafer with a resin before a step of separating the semiconductor devices from a semiconductor wafer.

An example is disclosed in "NIKKEI MICRODEVICES, pp. 164–167", published on April, 1998. However, in a step of separating semiconductor chips from a semiconductor wafer which is covered by a resin according to the publication, it is difficult to precisely identify cutting points since a surface of the semiconductor wafer is covered by an opaque resin.

SUMMARY OF THE INVENTION

An object of this invention is to provide a method for manufacturing in which is possible to recognize grid lines which are hidden by an opaque resin.

To achieve the object, one aspect of the invention includes a stop of forming marks on a semiconductor wafer, wherein the marks are distinguished from electrodes which are formed on the semiconductor wafer.

According to the invention, in a dicing process, separating semiconductor chips from the semiconductor wafer can be precisely achieved. That is, it is possible to realize a manufacturing process of good quality.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood.

Figure 1:
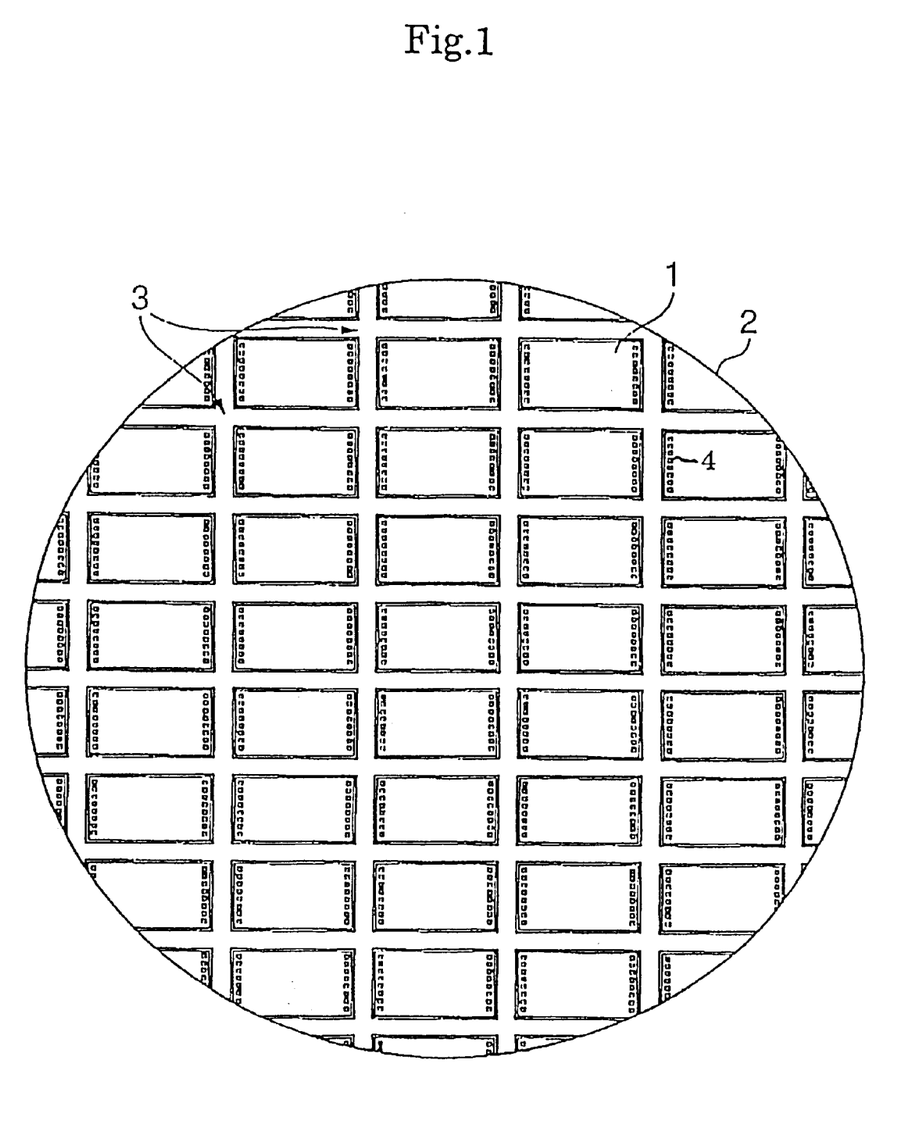
FIG. 1 is a plane view of a semiconductor wafer according to a first preferred embodiment of the present invention.

FIG. 1 is a plane view of a semiconductor wafer 2 according to a preferred embodiment of the present invention. The semiconductor wafer 2 is formed with a plurality of circuit elements 1 thereon. The circuit elements 1 are semiconductor integrated circuits and are arranged in rows and columns. Grid lines 3 are arranged between the circuit elements 1. The circuit elements 1 are surrounded and sectioned by the grid lines 3. The grid lines 3 are also called scribing lines or dicing lines. A plurality of electrode pads 4 are formed on the circuit elements 1. The electrode pads 4 are electrically connected to the circuit elements 1. Also, surfaces of the electrode pads 4 are exposed in order to allow connection with conductive lines or conductive materials which are formed on the electrode pads 4.

Figure 2A:
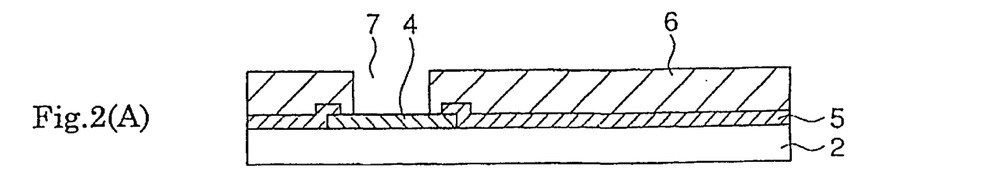
FIG. 2(A)–FIG. 2(E) are cross sections according to the first preferred embodiment.

As shown in FIG. 2(A), the semiconductor wafer 2 is covered with an insulating film 5, excepting the surfaces of the electrode pads 4. An intermediate insulating layer 6 is formed on the semiconductor wafer 2. The intermediate insulating layer 6 has openings 7 which are located above the electrode pads 4. In this preferred embodiment, the intermediate insulating layer 6 is comprised of a polyimide.

Figure 2B:
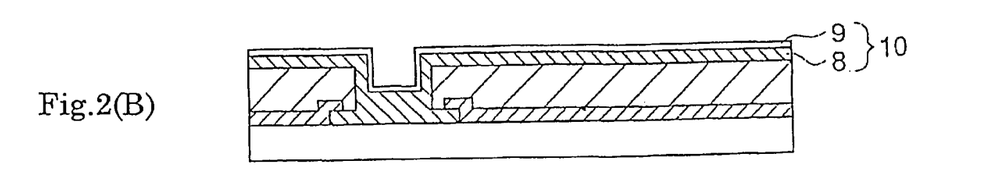

Next, a metal layer 10 is deposited on such wafer 2 by a sputtering method, as shown in FIG. 2(B). The metal layer 10 is composed of an adherent metal layer 8 and a conductive layer 9. In this embodiment, the electrode pads 4 are comprised of an aluminum or an aluminum-alloy, the adherent metal layer 8 is comprised of a titanium and the conductive layer 9 is comprised of a copper. The adherent metal layer 8 is formed for adherence between an upper layer and a lower layer. The adherent metal layer 8 can be comprised of an aluminum, an aluminum-alloy, a titanium-tungsten-alloy, or a chrome.

Figure 2C:
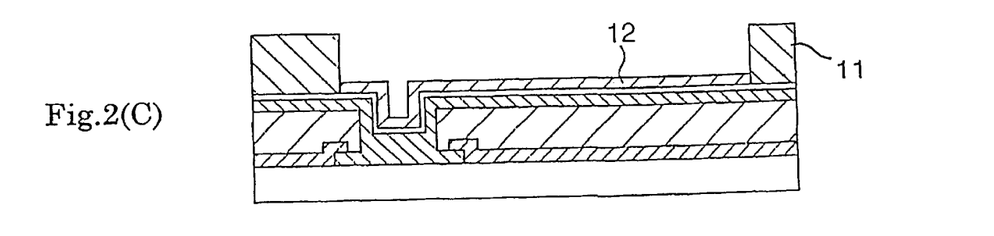

As shown in FIG. 2(C), a resist layer 11 is formed on the metal layer 10 and is patterned with a predetermined design. Then, a conductive line 12 is formed on the conductive layer 9 by a metallizing plating method, such as an electroplating method. The conductive line 12 is comprised of a copper and is formed in order to improve electrical characteristics and a step coverage.

Figure 2D:
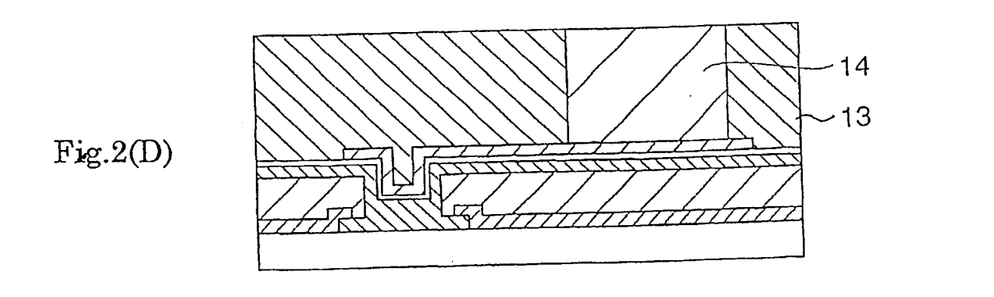

Then, as shown in FIG. 2(D), the resist layer 11 is removed and a resist layer 13 is formed on the conductive line 12. The resist layer 13 is patterned and is opened at predetermined points. Bump electrodes 14 are formed in the predetermined points in the resist layer 13. The bump electrodes 14 are comprised of a copper or a gold.

Figure 2E:
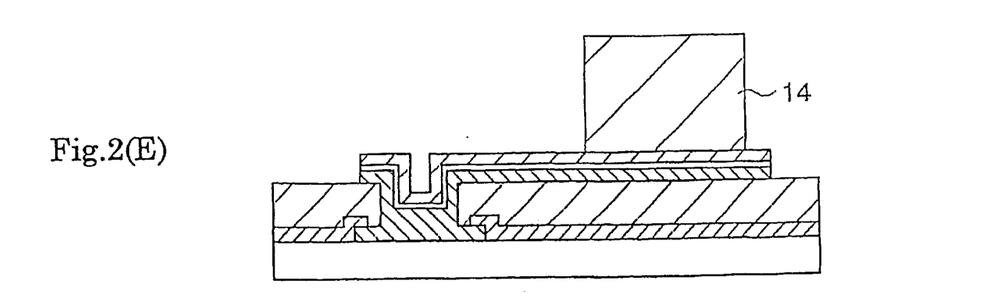

Then, the resist layer 13 is removed and parts of the metal layer 10 is etched using the conductive line 12 as a mask, as shown in FIG. 2(E).

Also, as explained below, the process of the invention includes the formation of marks on the wafer 2 which are distinguishable from the bump electrodes 14.

Figure 3A:
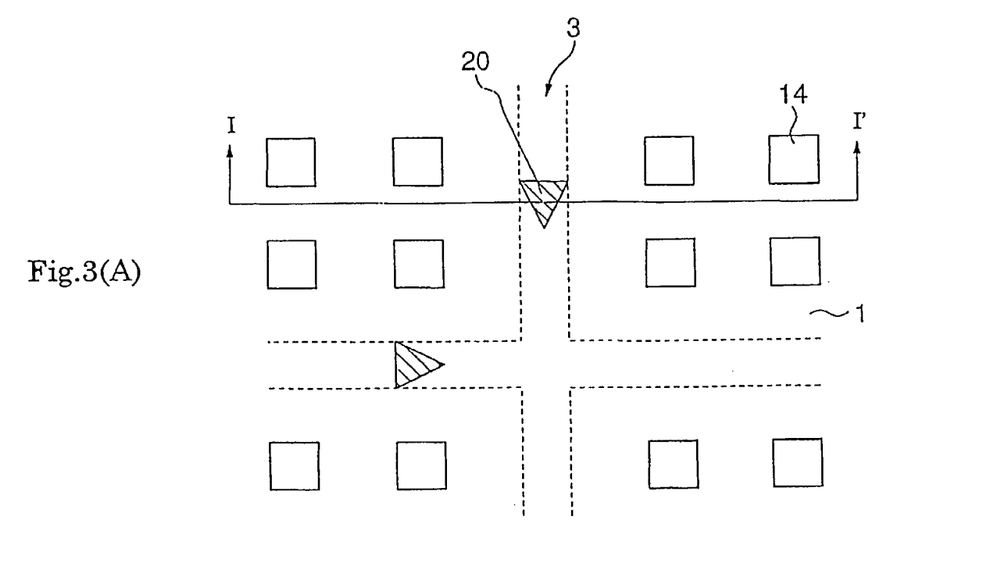
FIG. 3(A) is a expansion plane view of a part of the semiconductor wafer according to the first preferred embodiment.
Figure 3B:
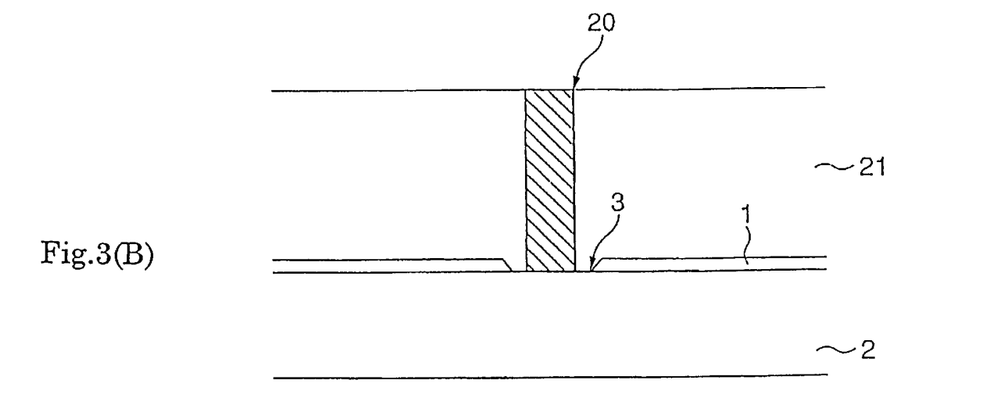
FIG. 3(B) is a cross section at a portion of line I–I' shown in FIG. 3(A).

FIG. 3(A) is a expansion plane view of a part of the semiconductor wafer 2. FIG. 3(B) is a cross section at a portion along line I–I' shown in FIG. 3(A). The bump electrodes 14 are formed above the circuit elements 1 and marks 20 are formed on the grid lines 3. The marks 20 may distinguishable from the bump electrodes 14. In this embodiment, the marks 20 have a triangular configurations and the bump electrodes 14 have a squared configuration. However, the invention is not limited to such configurations. In FIG. 3(A), the bump electrodes 14 are regularly grouped in rows and columns and the marks 20 are out positioned outside the groups. So, even if the bump electrodes 14 and the marks 20 have the same configuration, they could be distinguished clearly.

The marks 20 can be formed simultaneously with the bump electrodes 14. If both the marks 20 and bump electrodes 14 are formed simultaneously, the resist layer 13 shown in FIG. 2(D) is also patterned and opened for the marks 20. Then, the bump electrodes 14 and the marks 20 are formed simultaneously with a metallizing plating method. In this case, the bump electrodes 14 and the marks 20 are made of the same material.

Such a semiconductor wafer 2 is then covered by a resin 21, as shown in FIG. 3(B). Top surfaces of the bump electrodes 14 and marks 20 are exposed from the surface of the resin 21. If necessary, the surface of the resin 21 is polished in order to expose the top surfaces of the bump electrodes 14 and marks 20. The surface of the resin 21 is substantially flat and is substantially level with the top surfaces of the bump electrodes 14 and the marks 20.

Then, the semiconductor wafer 2 which is covered by the resin 21 is separated along the grid lines 3 in a dicing process. As the grid lines 3 are covered by the resin 21, locations of the grid lines 3 can not be recognized directly. However, it is possible to assume the locations of the grid lines 3, since the marks 20 are exposed on the surface of the resin 21. If the semiconductor wafer 2 is divided along an extended line from the marks 20, it is possible to separate the circuit elements 1 from the semiconductor wafer 2 exactly. That is, it is possible to realize a manufacturing process of good quality.

Figure 4A:
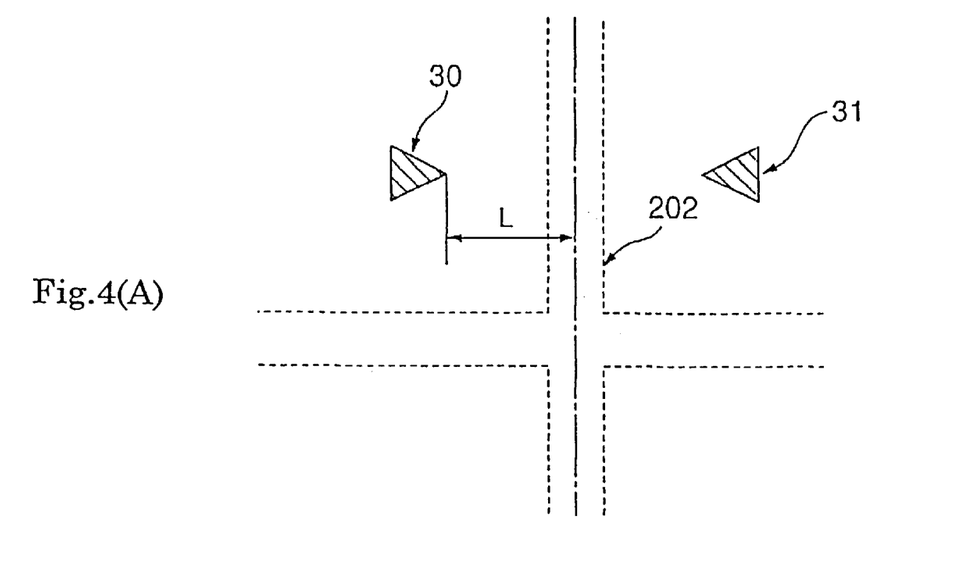
FIG. 4(A) is a plane view of a first variation according to the first preferred embodiment.
Figure 4B:
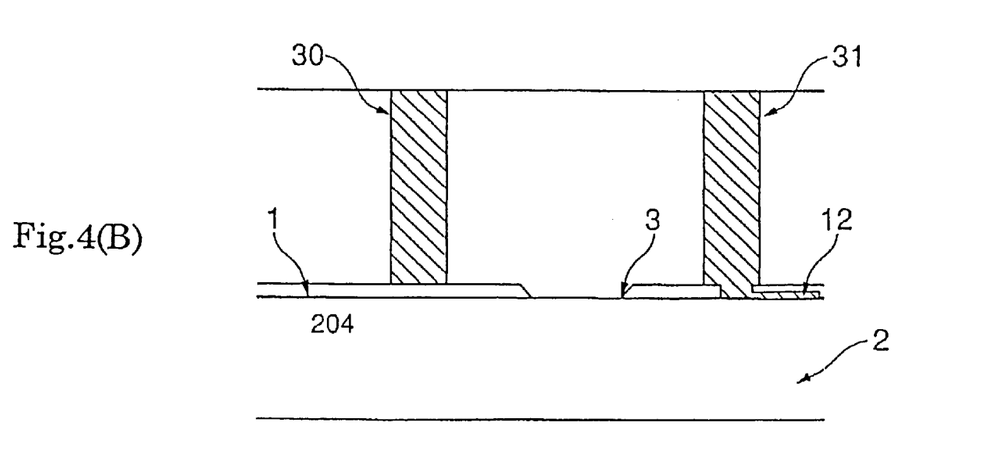
FIG. 4(B) is a cross section of FIG. 4(A).

FIG. 4(A) is a plane view of another example according to the first embodiment. FIG. 4(B) is a cross sectional of FIG. 4(A).

The marks 20 of FIG. 3(A) are arranged on the gird lines 3. However, the marks 30 can be arranged at a predetermined distance L from a center of the grid lines 3, as shown in FIG. 4(A). That is, the marks 30 are formed above the circuit elements 1.

According to the arrangement shown in FIG. 4(A), as a blade of a dicing saw which is used to separate the semiconductor wafer 2 does not touch the marks 30 directly, clogging of the blade is avoided.

Also, the marks 31 are arranged at the distance L from the center of the grid lines 3, shown in FIG. 4(A). And the marks 31 are connected to the electrode pads. That is, the marks 31 are used as one of the bump electrodes. In this case, the marks 30 have a different shape or a different size from the bump electrodes 14 in order to recognize the marks easily.

As the marks 30 can serve both as bump electrodes and marks, the step of forming separate marks can be omitted.

Figure 5:
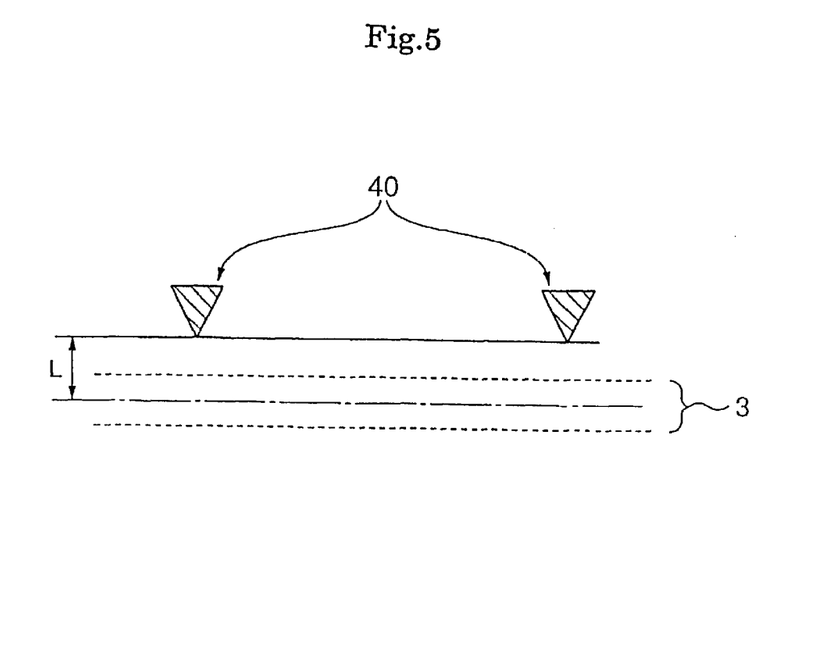
FIG. 5 is a plane view of a second variation according to the first preferred embodiment.

If the marks 31 are arranged at the distance L from the center of the grid lines 3, it is desirable to arrange a plurality of marks 40 (at least two) which are parallel with the grid lines 3, as shown in FIG. 5. As it is possible to specify the location of the grid lines 3 which are straight lines exactly, by recognizing the marks 40, it is possible to realize a manufacturing process of good quality.

Figure 6:
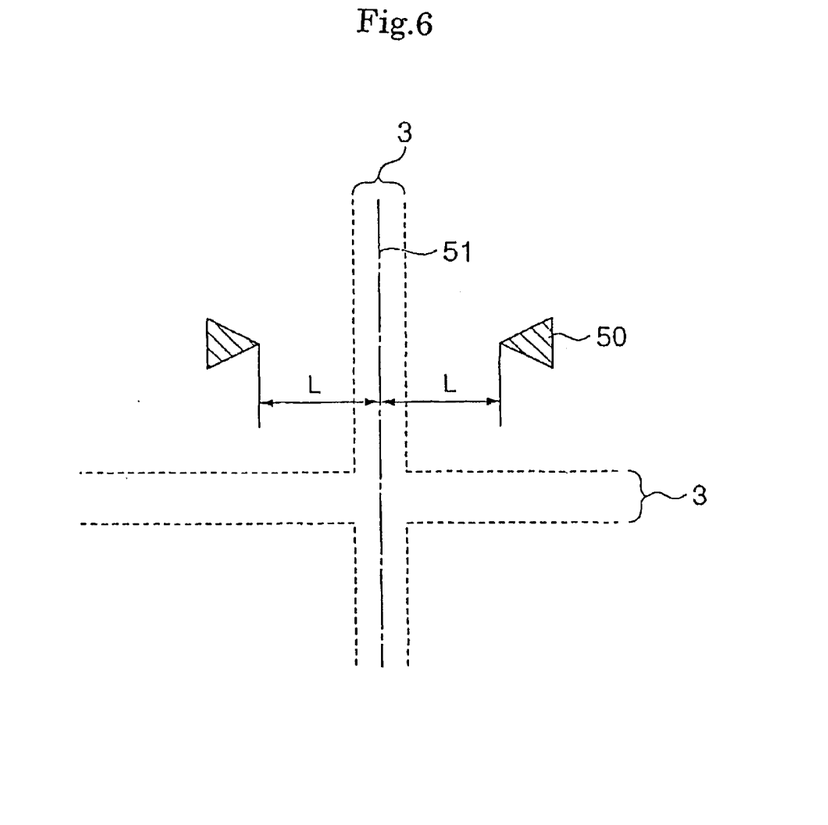
FIG. 6 is a plane view of a third variation according to the first preferred embodiment.

Two marks can be arrange to be symmetric with respect to the grid lines 3. In FIG. 6, a pair of marks 50 are arranged at the distance L from the center 51 of the grid line 3 and are symmetric with the center 51. According to the arrangement of the pair of marks 50, it is not necessary to measure the distance L, since it is easy to specify the center of grid line using the pair of marks 50.

Figure 7A:
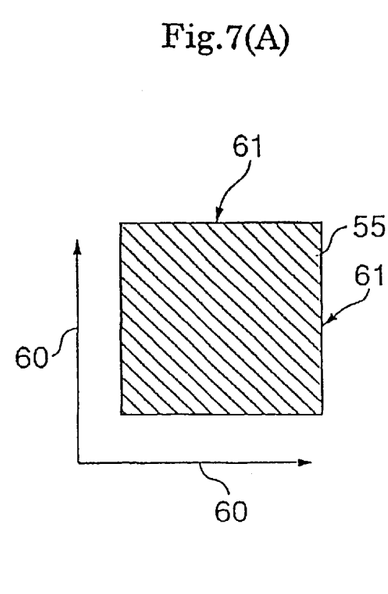
FIG. 7(A)–FIG. 7(D) are variations of a mark according to the first preferred embodiment.
Figure 7B:
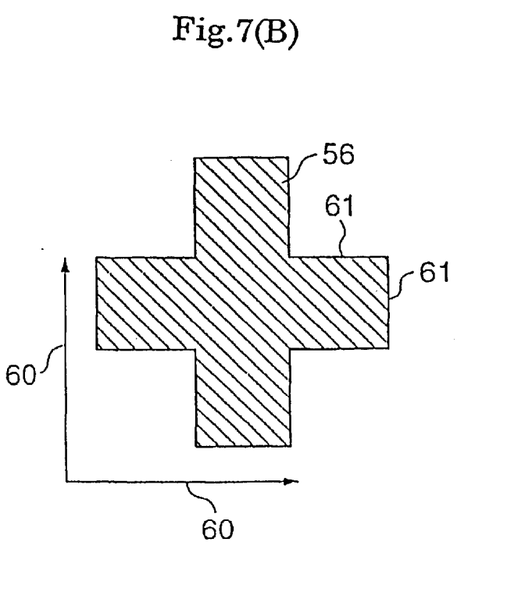
Figure 7C:
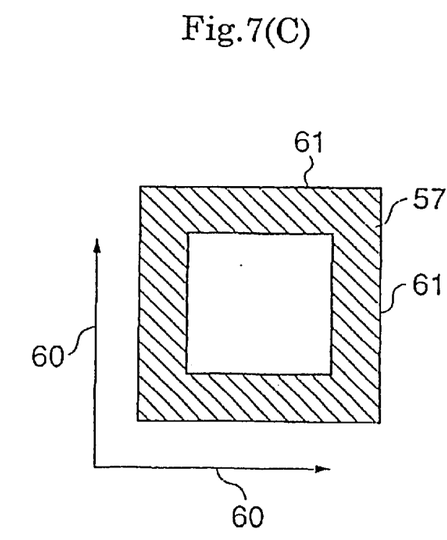
Figure 7D:
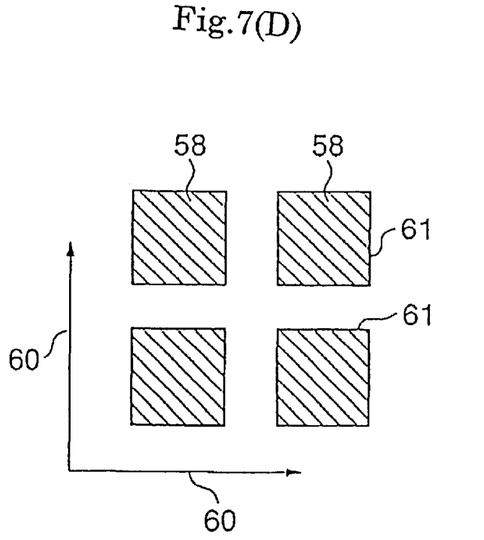

The marks mentioned above are shown having a triangle shape. However, other shapes can be adopted, such as a square shaped mark 55 shown in FIG. 7(A), a cross shaped mark 56 shown in FIG. 7(B), a square frame shaped mark 57 shown in FIG. 7(C) and a plurality of square shaped marks 58 shown in FIG. 7(D). These marks include segments 61 which are parallel with segments 60 of the grid lines.

According to these marks, both the location of the grid lines and the directional orientation of the grid lines can be recognized. Therefore, fewer marks are needed to recognize the grid lines, as compared with the examples mentioned previously.

Figure 8:
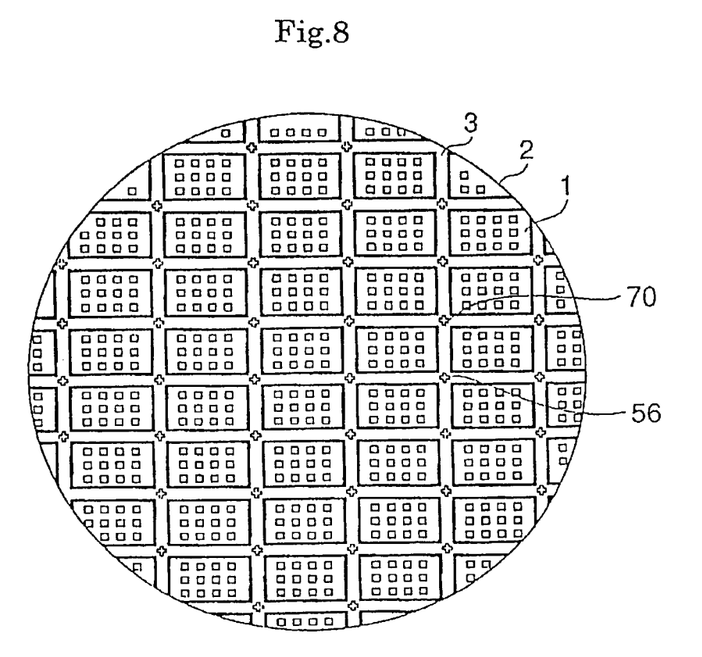
FIG. 8 is a plane view of a fourth variation according to the first preferred embodiment.

The marks can be arranged at intersections of the grid lines. In FIG. 8, the cross shaped marks 56 are arranged at the intersections 70 of the grid lines 3. The marks are not limited to the cross shape, and other shapes which are described above can be applied.

Figure 9:
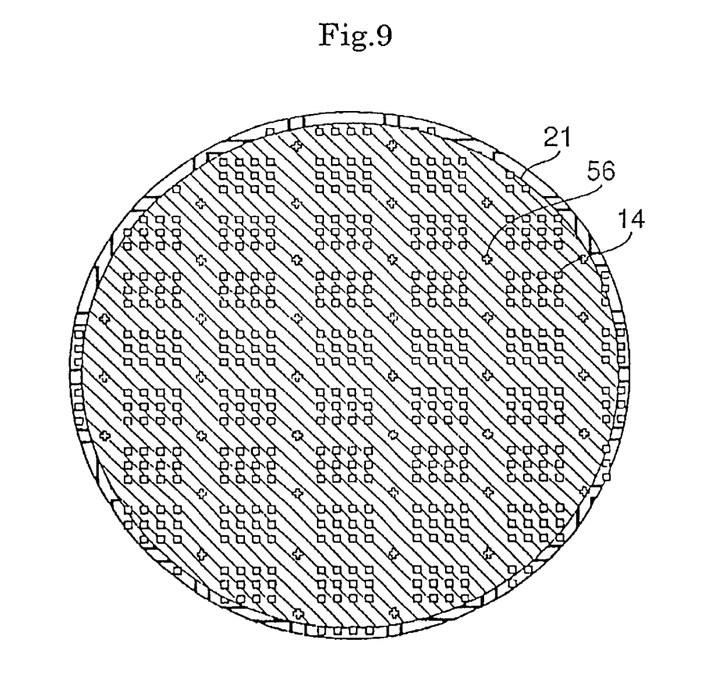
FIG. 9 is a semiconductor wafer of the fourth variation which is covered by a resin.

FIG. 9 shows the semiconductor wafer 2 which is covered by the resin 21. Top surfaces of the bump electrodes 14 and marks 56 are exposed from the surface of the resin 21. If necessary, the surface of the resin 21 is polished in order to expose the top surfaces of the bump electrodes 14 and marks 56.

Since the resin 21 is opaque, it is difficult to recognize the grid lines 3 directly after being covered by the resin 21. However, as parts of the marks 56 are exposed in the surface of the resin 21, it is possible to indirectly identify the locations of the grid lines 3. As the marks 56 have a different configuration or size from the bump electrodes 14, the marks 56 are easy to recognize in the surface of the resin 21.

Figure 10:
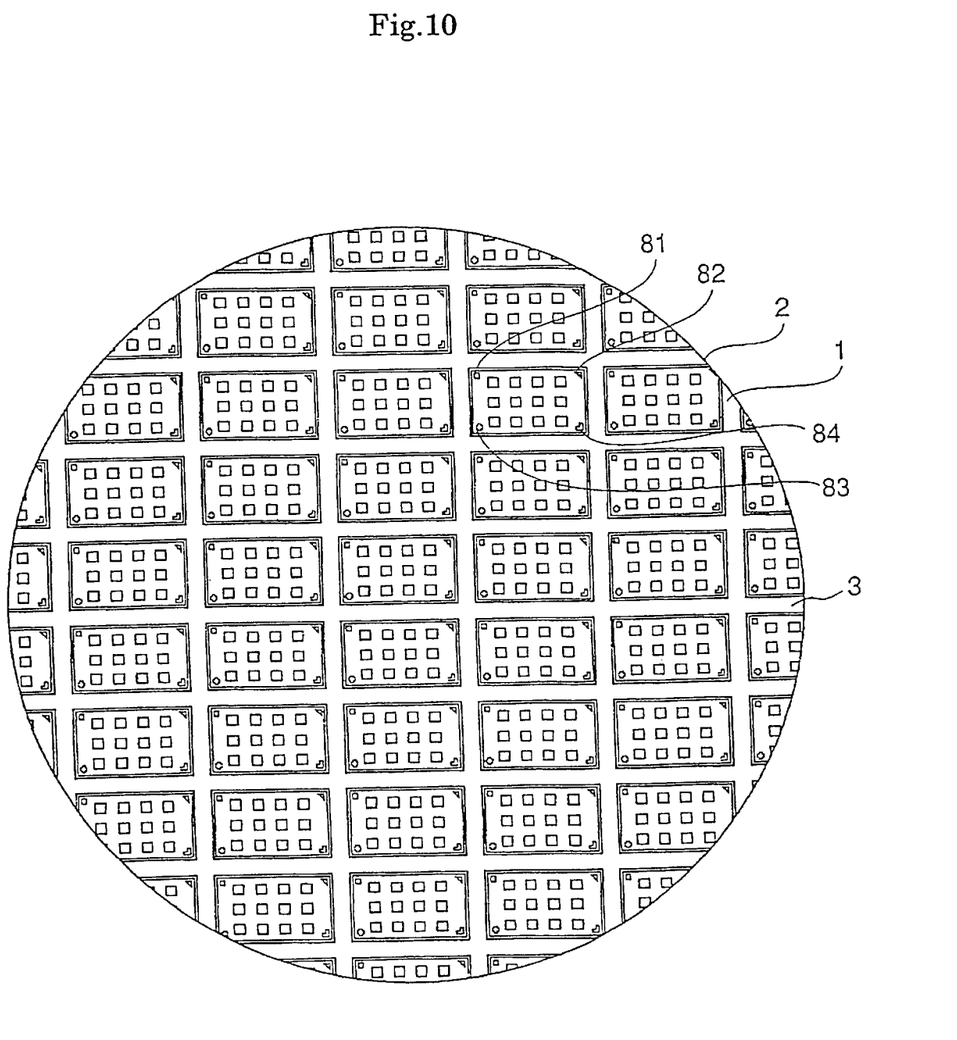
FIG. 10 is a plane view of a fifth variation according to the first preferred embodiment.

FIG. 10 shows other marks which have a different configuration and a different arrangement. In FIG. 10, four marks 81, 82, 83, 84 which are different from each other are arranged at the four corners of the circuit elements 1. The mark 81 is a squared shaped figure, the mark 82 is a triangle shaped figure, the mark 83 is a cross shaped figure and the mark 84 is an L-shaped figure.

Figure 11:
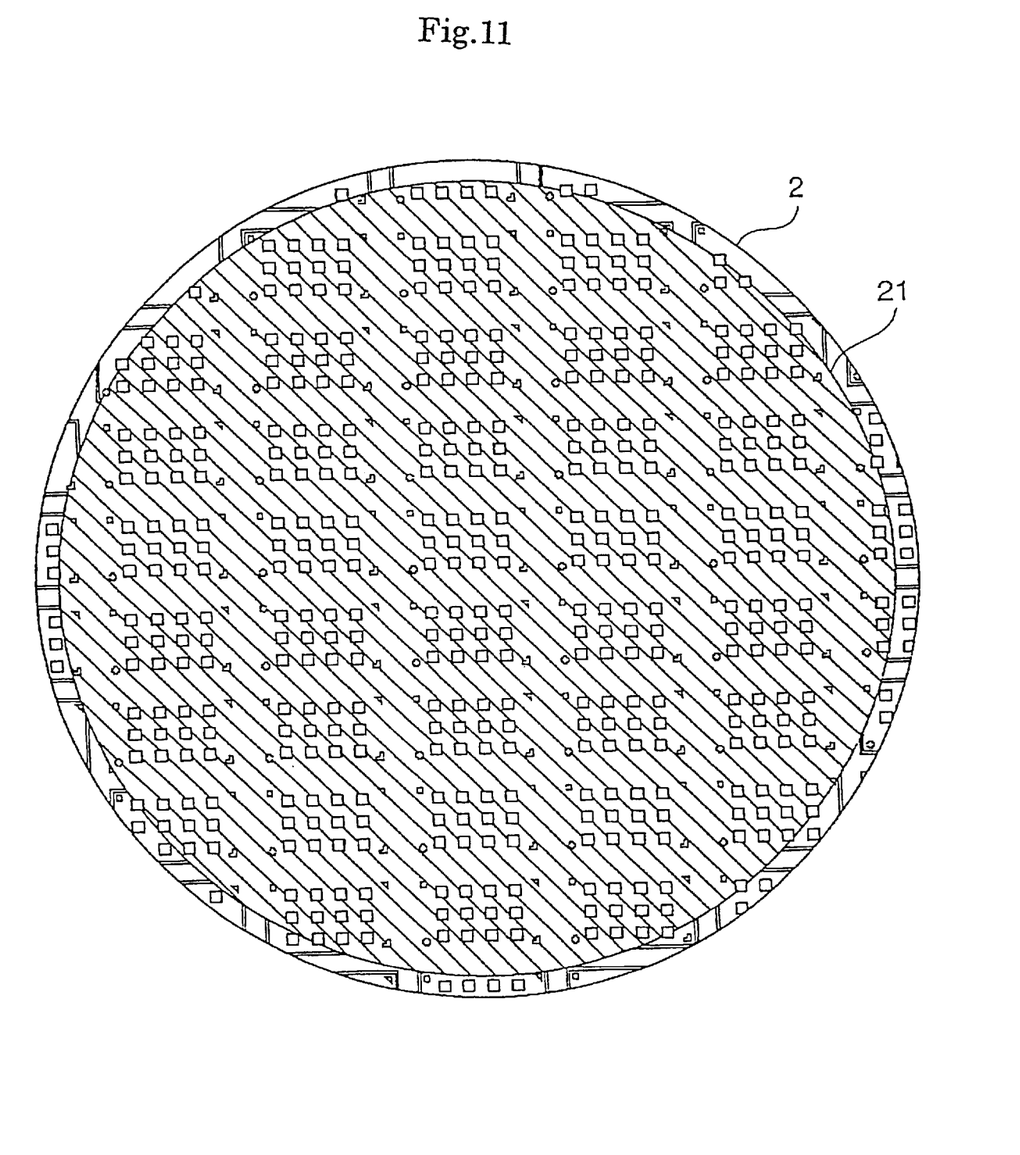
FIG. 11 is a semiconductor wafer of the fifth variation which is covered by a resin.

FIG. 11 shows the semiconductor wafer 2 which is covered by the resin 21. Top surfaces of the bump electrodes 14 and marks 81, 82, 83, 84 are exposed from the surface of the resin 21. If necessary, the surface of the resin 21 is polished in order to expose the top surfaces of the bump electrodes 14 and marks 81, 82, 83, 84.

Because the resin 21 is opaque, it is difficult to recognize the grid lines 3 directly after being covered by the resin 21. However, as parts of the marks 81, 82, 83, 84 are exposed in the surface of the resin 21, it is possible to indirectly identify the locations of the grid lines 3.

According to this example, as the marks which have different configurations remain after dividing the semiconductor wafer, a direction of the circuit elements 1 can be recognized exactly. Recognizing the direction of the circuit elements is useful in specifying the plurality of the bump electrodes.

If necessary, a plurality of ball shaped electrodes are formed on the bump electrodes 14 before the dividing the semiconductor wafer.

A second preferred embodiment of the present invention is described hereinafter, referring to FIGS. 12(A) and FIG. 12(B).

A plurality of circuit elements 101 are formed on a semiconductor wafer 102. The circuit elements 101 are semiconductor integrated circuits and are arranged in rows and columns. Grid lines 103 are arranged between the circuit elements 101. The semiconductor wafer 102 is covered with a resin 104. Also, parts of a plurality of bump electrodes (not shown) are exposed in a surface of the resin 104 in order to connect conductive materials.

Since the resin 104 is opaque, it is difficult to recognize the grid lines 103 directly after being covered by the resin.

Figure 12A:
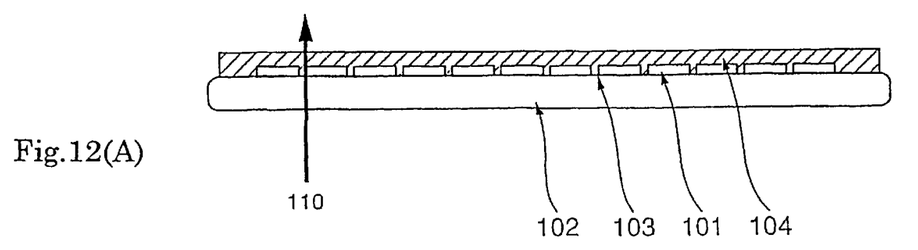
FIG. 12(A) and FIG. 12(B) are cross sections according to a second preferred embodiment of the present invention.

In this embodiment, locations of the grid lines 103 are recognized by an X-ray 110 which can penetrate through the resin 104 and the semiconductor wafer 102, as shown in FIG. 12(A).

Such a method is utilized for detecting differences of transmissivity of different materials. So, the materials and thicknesses of the grid lines 103 and circuit elements 101 are taken into consideration for easy recognition.

Figure 12B:
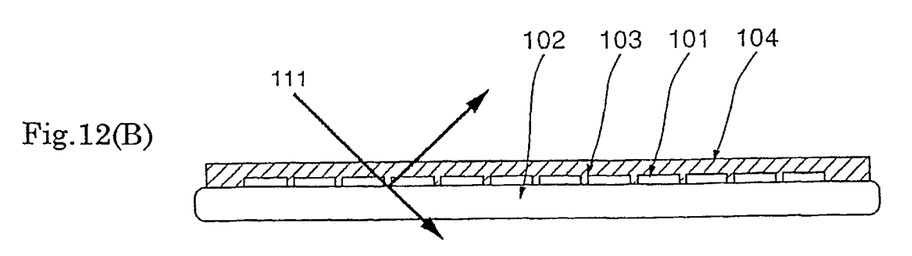

Further, as shown in FIG. 12(B), locations of the grid lines 103 may be recognized by an infrared ray or supersonic waves 111 which can penetrate through the resin 104 and can be reflected by the semiconductor wafer 102.

Also, such method is utilized for detecting differences of reflectance of different materials. So, the materials and thicknesses of the grid lines 103 and circuit elements 101 are taken into consideration for easy recognition.

According to these methods, as it is possible to recognize the grid lines which are hidden by the opaque resin, separating the circuit elements from the semiconductor wafer is precisely carried out in the dicing process. That is, it is possible to realize a manufacturing process of good quality.

A third preferred embodiment of the present invention is described hereinafter, referring to FIGS. 13(A)–13(F).

Figure 13A:
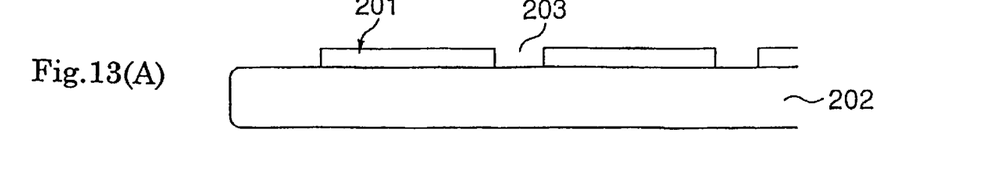
FIG. 13(A)–FIG. 13(F) are cross sections according to a third preferred embodiment of the present invention.

A plurality of circuit elements 201 are formed on a semiconductor wafer 202, as shown in FIG. 13(A). Grid lines 203 are arranged between the circuit elements 202.

Figure 13B:
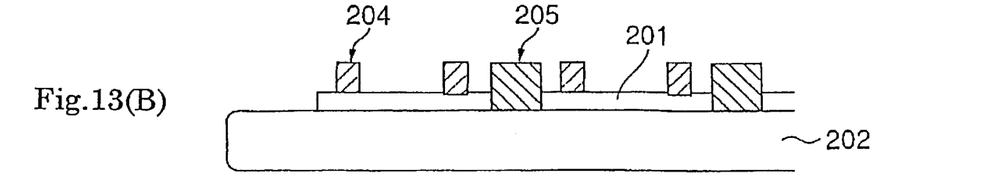

Next, bump electrodes 204 which are connected to the circuit elements 201 and bump electrodes 205 are formed simultaneously. The bump electrodes 204 are formed on the circuit elements 201, the bump electrodes 205 are formed on the grid lines 203, as shown in FIG. 13(B). The bump electrodes 204, 205 are formed by a metallizing plating method. In this embodiment, the bump electrodes 204, 205 are comprised of copper. Also, the bump electrodes 204, 205 can be comprised of other materials, such as gold or solder.

Figure 13C:
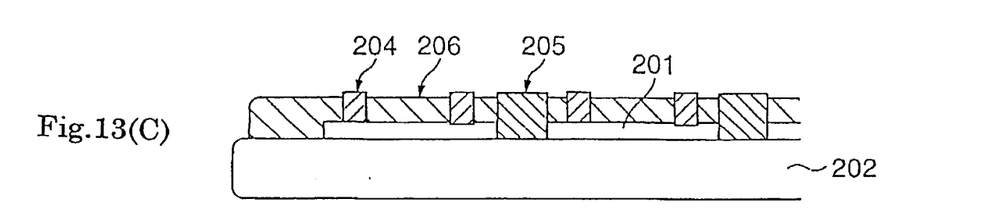

Next, the semiconductor wafer 202 is covered by a resin 206, as shown in FIG. 13(C). Top surfaces of the bump electrodes 204, 205 are exposed from the surface of the resin 206. If necessary, the surface of the resin 206 is polished in order to expose the top surfaces of the bump electrodes 204, 205.

Figure 13D:
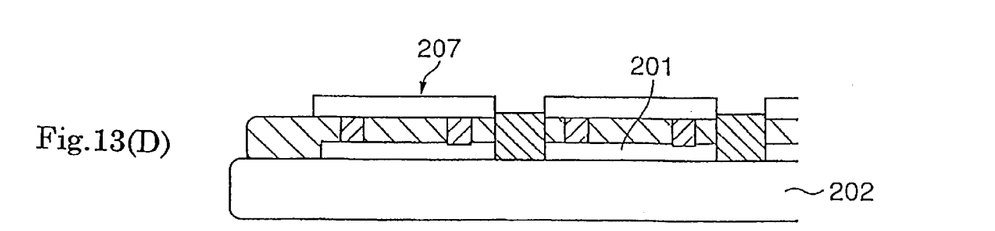

A resist 207 is formed so as to cover the surface of the bump electrodes 204 which are exposed from the surface of the resin 206, as shown in FIG. 13(D). The resist 207 is patterned by a general photo-etching method. An application method using a needle and a printing method can be used to form the resist 207.

Figure 13E:
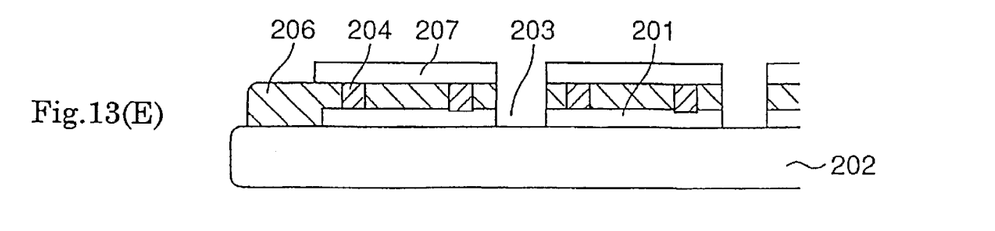

Then, the bump electrodes 205 which are on the grid lines 3 are removed by a sulfuric acid or a hydrochloric acid, as shown in FIG. 13(E), in cases where the bump electrodes 205 are comprised of copper or solder. If the bump electrodes 205 are comprised of gold, a potassium iodide is used.

Figure 13F:
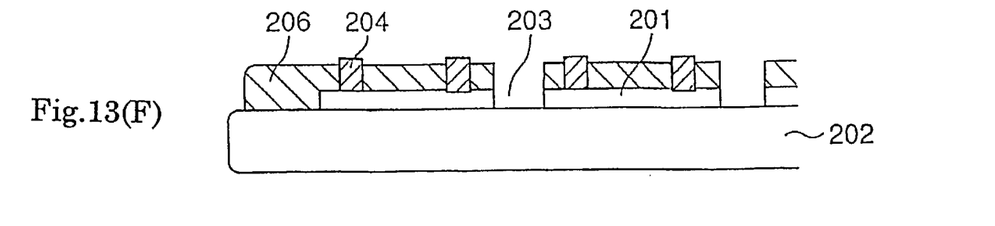

The resist 207 which covers the top surface of the bump electrodes 204 is removed, as shown in FIG. 13(F).

In a dicing process, as the grid lines 203 are exposed, it is easy to recognize the grid lines.

According to the third embodiment, as it is possible to recognize the grid lines, separating the circuit elements from the semiconductor wafer is exactly in the dicing process. That is, it is possible to realize a manufacturing process of good quality.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as falling within the true scope of the invention.

What is claimed is:

1. A semiconductor wafer, comprising:

a plurality of circuit elements which are formed on a surface of the semiconductor wafer, wherein the circuit elements are sectioned by grid lines;

a plurality of electrodes which are located on the circuit elements, the electrodes respectively connected to the circuit elements;

a plurality of marks on the surface of the semiconductor wafer which are indicative at locations of the grid lines and which are distinguished from the electrodes; and a resin, which covers the surface of the semiconductor water and sides of the electrodes and of the marks, but does not cover top surfaces of both the electrodes and the marks such that the top surfaces of the electrodes and the marks are exposed.

2. The semiconductor wafer according to claim 1, wherein a surface of the resin is substantially flat and is substantially level with the top surfaces of the electrodes and the marks.

3. The semiconductor wafer according to claim 1, wherein the marks are respectively arranged at four corners of one of the circuit elements are different from the each other.

4. The semiconductor wafer according to claim 2, wherein the marks which are respectively arranged at the four corners of the circuit elements are different from each other.

* * * * *